United States Patent
Ma et al.

(10) Patent No.: US 6,695,625 B1
(45) Date of Patent: Feb. 24, 2004

(54) ELECTRICAL CONNECTOR WITH DUAL-FUNCTION SIDEWALLS

(75) Inventors: Hao-Yuan Ma, Tu-Chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/318,593

(22) Filed: Dec. 13, 2002

(51) Int. Cl.[7] .............................................. H01R 12/00
(52) U.S. Cl. ........................ 439/70; 439/342; 439/525; 439/885; 439/330
(58) Field of Search .............................. 439/70, 71–72, 439/342, 885, 525, 526, 527, 330

(56) References Cited

U.S. PATENT DOCUMENTS

| | | | |
|---|---|---|---|
| 3,951,495 A | * | 4/1976 | Donaher et al. ............ 439/330 |
| 4,080,032 A | * | 3/1978 | Cherian et al. ............ 439/268 |
| 4,542,949 A | * | 9/1985 | Tewes et al. ................ 439/70 |
| 4,616,895 A | * | 10/1986 | Yoshizaki et al. .......... 439/330 |
| 5,066,245 A | * | 11/1991 | Walker ........................ 439/526 |
| 5,493,237 A | * | 2/1996 | Volz et al. ................... 324/754 |
| 5,788,510 A | * | 8/1998 | Walker ........................ 439/61 |

* cited by examiner

Primary Examiner—Truc Nguyen
(74) Attorney, Agent, or Firm—WeiTe Chung

(57) ABSTRACT

An electrical connector (1) for connecting a land grid array (LAG) chip with a printed circuit board (PCBA) includes a housing (10), and terminals (110) received in passageways (101) of the housing. The housing has a base (100) and sidewalls (102, 104), the base and the sidewalls cooperatively defining a space therebetween for retaining the LAG chip. Two sidewalls each define recesses (1021), thereby forming projections (1020). When terminals are installed near the projections, a carrier strip (11) connecting the terminals is bent so that connecting sections (111) of the carrier strip are received in corresponding recesses. The connecting sections are cut off, and the carrier strip is removed. The recesses enable the carrier strip to be manipulated so that sufficient space is made available for cutting off of the connecting sections without interfering with the sidewalls. The projections provide precise fitting positioning of the LAG chip in the space.

3 Claims, 5 Drawing Sheets

ELECTRICAL CONNECTOR WITH DUAL-FUNCTION SIDEWALLS

BACKGROUND OF THE INVENTION

1. Field of the Invention

The present invention relates to an electrical connector for electrically connecting an electronic package such as a land grid array (LAG) chip with a circuit substrate such as a printed circuit board (PCB), and particularly to a connector having sidewalls that securely position the electronic package there between and that facilitate installation of terminals into the connector.

2. Description of the Prior Art

Land grid array (LAG) electrical connectors are widely used in the connector industry for electrically connecting LAG chips to printed circuit boards (PCBs) in personal computers (PCs). As described in "Nonlinear Analysis Helps Design LAG Connectors" (Connector Specifier, February 2001, pp. 18–20), the LAG connector mainly comprises an insulative housing and a multiplicity of terminals. The housing comprises a multiplicity of terminal passageways defined therein in a generally rectangular array for interferentially receiving corresponding terminals. Due to the very high density of the terminal array in a typical LAG chip, the LAG chip need to be precisely seated on the LAG connector to ensure reliable signal transmission between the terminals and the LAG chip. Means for accurately attaching the LAG chip to the LAG connector are disclosed in U.S. Pat. Nos. 4,504,105, 4,621,884, 4,692,790, 5,302,853 and 5,344,334.

Referring to FIG. 4, a conventional connector 6 comprises an insulative housing 60 and a multiplicity of terminals 61 received therein. In forming the connector 6, a carrier strip (not shown) comprises a row of the terminals 61, and a row of connecting sections 610 respectively connecting the terminals 61 with a main body of the carrier strip. The housing 60 comprises four raised sidewalls 62, and a flat base 63 disposed between the four raised sidewalls 62. The base 63 and the sidewalls 62 cooperatively define a space there between for receiving an LAG chip (not shown) therein. The base 63 defines a multiplicity of terminal passageways 64 for receiving the terminals 61 therein. When the LAG chip is seated on the LAG connector 6, the four sidewalls 62 can securely engage the LAG chip there between. However, installation of terminals 61 into those passageways 64 near the sidewalls 62 is problematic. Once the terminals 61 have been inserted into such passageways 64, the connecting sections 610 must be cut from their corresponding terminals 61. Because the carrier strip is located close to the sidewalls 62, there is insufficient space to manipulate the carrier strip to allow easy cutting off of the connecting sections 610. Such manipulation is blocked by the sidewalls 62, which is liable to sustain damage as a result.

FIG. 5 shows another conventional LAG connector 6' devised to overcome the above-described problem. The LAG connector 6' comprises a housing 60'. The housing 60' comprises a flat base 63' and four raised sides 62' surrounding the base 63'. Two opposite of the sides 62' each have a sloped surface that slants down toward the base 63'. The sloped surfaces provide additional space to manipulate a carrier strip to allow easy cutting off of connecting sections 610' from their corresponding terminals 61'. However, the sloped surfaces diminish the original advantage of the sides 62' being raised. That is, a reduced surface area of the sides 62' is available to retain the LAG chip there between. This can adversely affect the reliability of signal transmission between the terminals 61' and the LAG chip.

Therefore, a new LAG electrical connector which overcomes the above-mentioned problems is desired.

SUMMARY OF THE INVENTION

An object of the present invention is to provide an electrical connector for electrically connecting an electronic package such as an LAG chip with a circuit substrate such as a PCBA, whereby the electrical connector can facilitate installation of terminals into a housing thereof.

Another object of the present invention is to provide an electrical connector having sidewalls that securely position an electronic package there between and that facilitate installation of terminals into the connector.

To achieve the above objects, an electrical connector in accordance with a preferred embodiment of the present invention is for connecting a land grid array (LAG) chip with a printed circuit board (PCB). The connector includes an insulative housing, and a plurality of terminals received in a plurality of passageways defined in the housing. The housing has a flat base and sidewalls extending upwardly from the base, the base and the sidewalls cooperatively defining a space there between for retaining the LAG chip therein. Two opposite of the sidewalls each define a multiplicity of evenly spaced recesses therein, thereby forming a multiplicity of evenly spaced projections.

When terminals are installed near the projections, a common carrier strip connecting the terminals is bent down so that connecting sections of the carrier strip are received in corresponding recesses. Junction portions between the terminals and their respective connecting sections are cut, and a main body of the carrier strip having the connecting sections is removed. The recesses enable the carrier strip to be manipulated so that sufficient space is made available for cutting off of the connecting sections without interfering with the sidewalls thereat. The projections provide precise fitting positioning of the LAG chip in the space. This ensures that engagement between the terminals and pins of the LAG chip is accurate and reliable.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
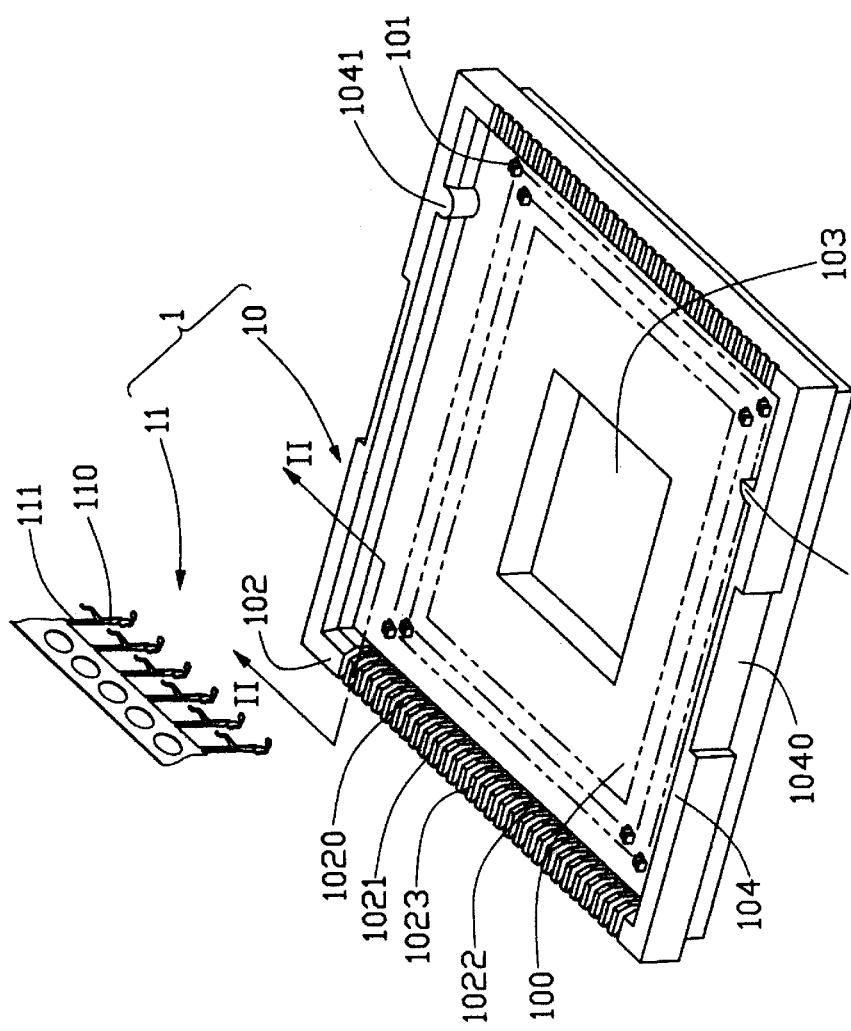
FIG. 1 is a simplified, exploded isometric view of an LAG electrical connector in accordance with a preferred embodiment of the present invention.
Figure 2:
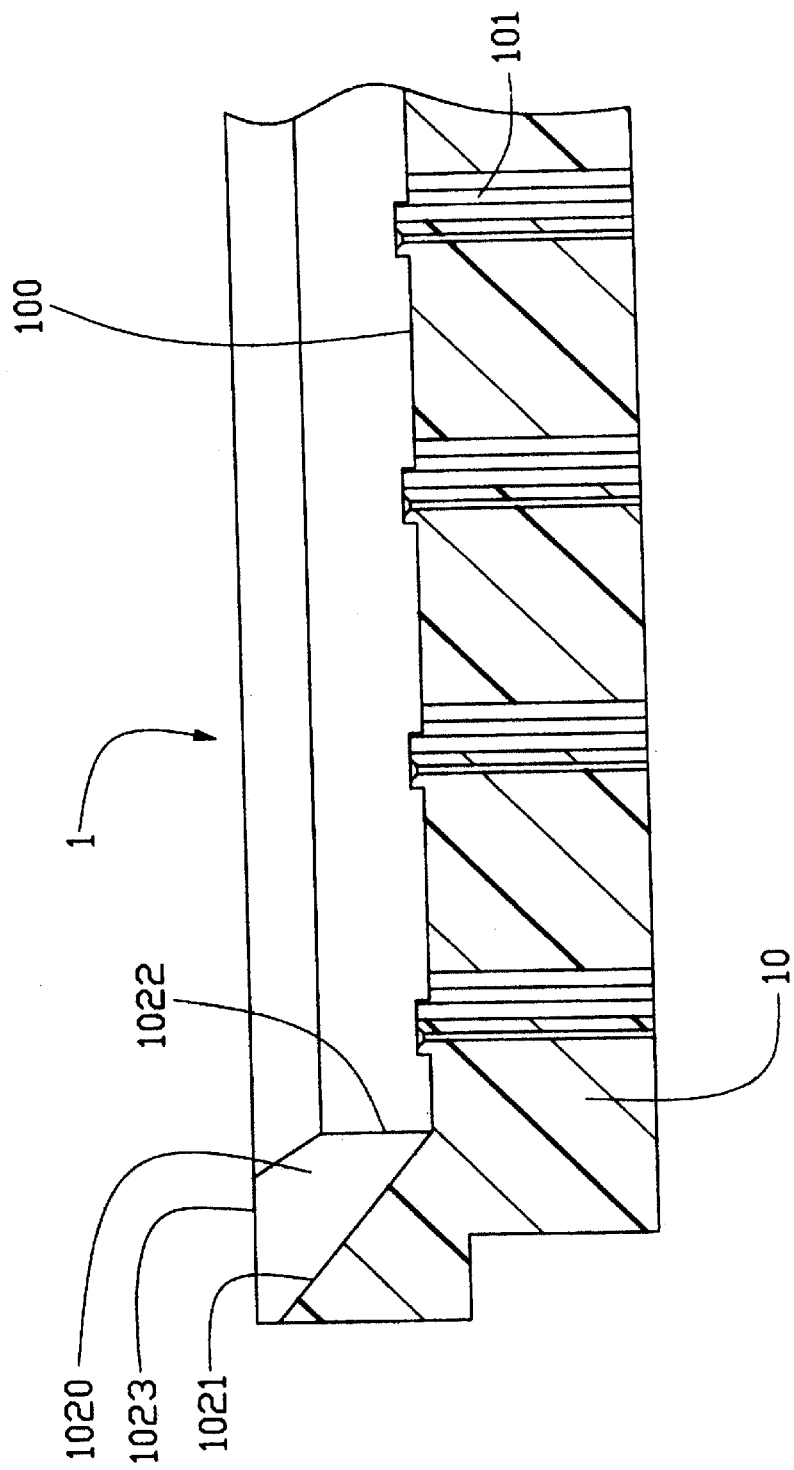
FIG. 2 is a cross-sectional view taken along line II—II of FIG. 1.

Referring to FIGS. 1 and 2, an LAG electrical connector 1 in accordance with a preferred embodiment of the present invention comprises an insulative housing 10 and a multiplicity of terminals 110. In forming the LAG connector 1, an exemplary carrier strip 11 comprises a row of the terminals 110, and a row of connecting sections 111 respectively connecting the terminals 110 with a main body of the carrier strip.

The housing 10 is substantially rectangular. The housing 10 comprises two opposite first sidewalls 102, two opposite second sidewalls 104 interconnecting the first sidewalls 102, and a flat base 100 disposed between the first and second sidewalls 102, 104. The base 100 and first and second sidewalls 102, 104 cooperatively define a space there between for receiving an LAG chip (not shown) therein. The base 100 defines a square central cavity 103 therein, and a multiplicity of terminal passageways 101 regularly arranged in a generally rectangular array for interferentially receiving corresponding terminals 10 therein. The first sidewalls 102 each define a multiplicity of evenly spaced recesses 1021 therein, thereby forming a multiplicity of evenly spaced projections 1020. Each recess 1021 is bounded at a bottom thereof by a sloped surface of the first sidewalls 102, such that an inner portion of the recess 1021 is disposed lower than an outer portion thereof. Accordingly, a side elevation cross section of each projection 1020 is trapezium-shaped. The projection 1020 comprises an inmost vertical first surface 1022, a top second surface 1023, and a chamfered surface between the first surface 1022 and the second surface 1023. Cutouts 1040 are defined in respective outer faces of the second sidewalls 104, for engagingly receiving a pick-up cover (not shown) that enables the LAG connector 1 to be transferred and mounted on a printed circuit board (not shown). A first protrusion 1041 and a second protrusion 1042 are respectively formed on opposite inner faces of the second sidewalls 104. The LAG chip can be guidably fixed between the first and second protrusions 1041, 1042 and the first surfaces 1022 of the first sidewalls 102.

In assembly of the LAG connector 1, firstly the housing 10 is molded. The carrier strip 11 is positioned above the base 100 of the housing 10, parallel and close to the first surfaces 1022 of the projections 102 of one first sidewalls 102. The carrier strip 11 is moved downwardly, so that the terminals 110 are received into corresponding terminal passageways 101 of the housing 10. The connecting sections 111 of the carrier strip 11 are located above the passageways 101, parallel to the first surfaces 1022 of the projections 102 and opposite corresponding recesses 1021 of the first sidewalls 102. The carrier strip 11 is bent down toward the first sidewalls 102, so that the connecting sections 111 of the carrier strip 11 are received in the corresponding recesses 1021. Junction portions between the terminals 110 and their respective connecting sections 111 are cut, and the main body of the carrier strip 11 having the connecting sections 111 is removed. The above procedure is repeated as necessary for one or more other carrier strips 11 at either or both of the first sidewalls 102. Thus, assembly of the LAG connector 1 is completed. The recesses 1021 enable the carrier strip 11 to be manipulated so that sufficient space is made available for cutting off of the connecting sections 111 without interfering with the first sidewalls 102.

The LAG chip (not shown) is then pushed onto the base 100 of the housing 10. Pins of the LAG chip are engaged with the terminals 110, thus connecting the LAG chip with the connector 1. The projections 1020 of the first sidewalls 102 and the first and second protrusions 1041, 1042 of the second sidewalls 104 cooperate to precisely fittingly position the LAG chip there between. This ensures that the engagement between the terminals 110 and pins of the LAG chip is accurate and reliable.

Figure 3:
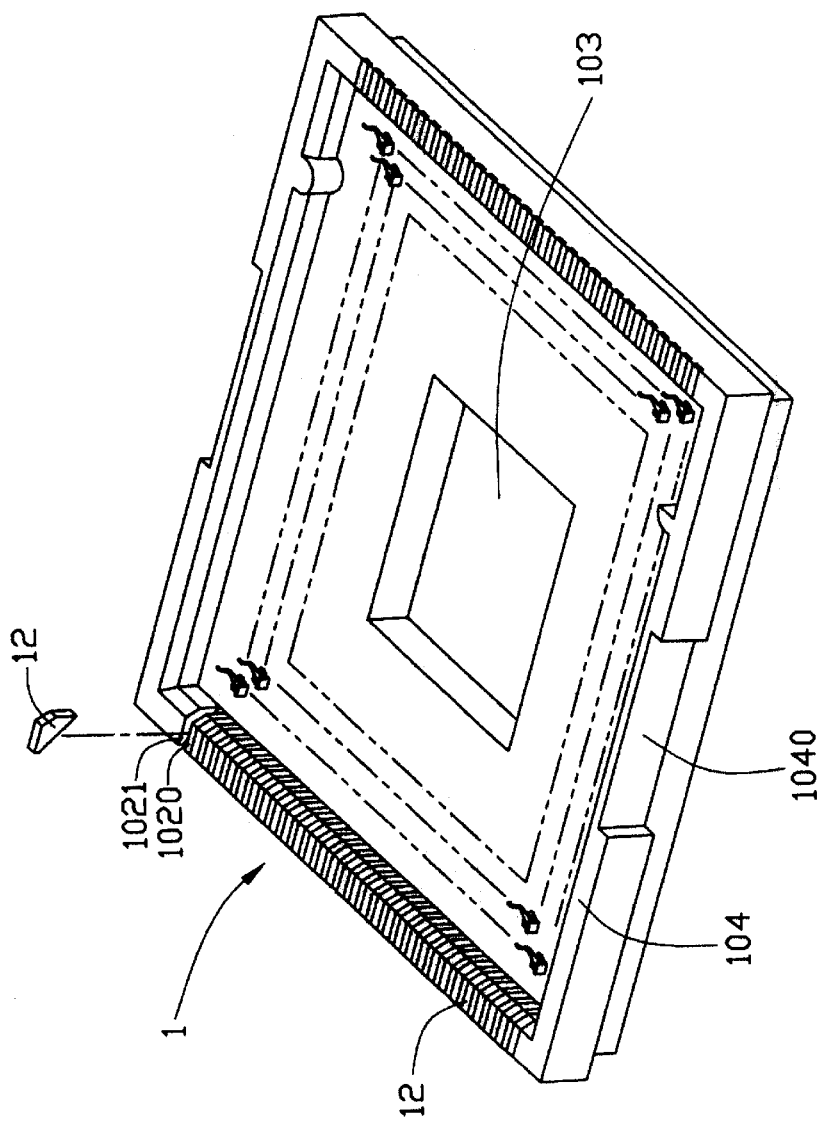
FIG. 3 is essentially a assembled view of FIG. 1, together with a complementary block ready for insertion into one of recesses of the connector.
Figure 4:
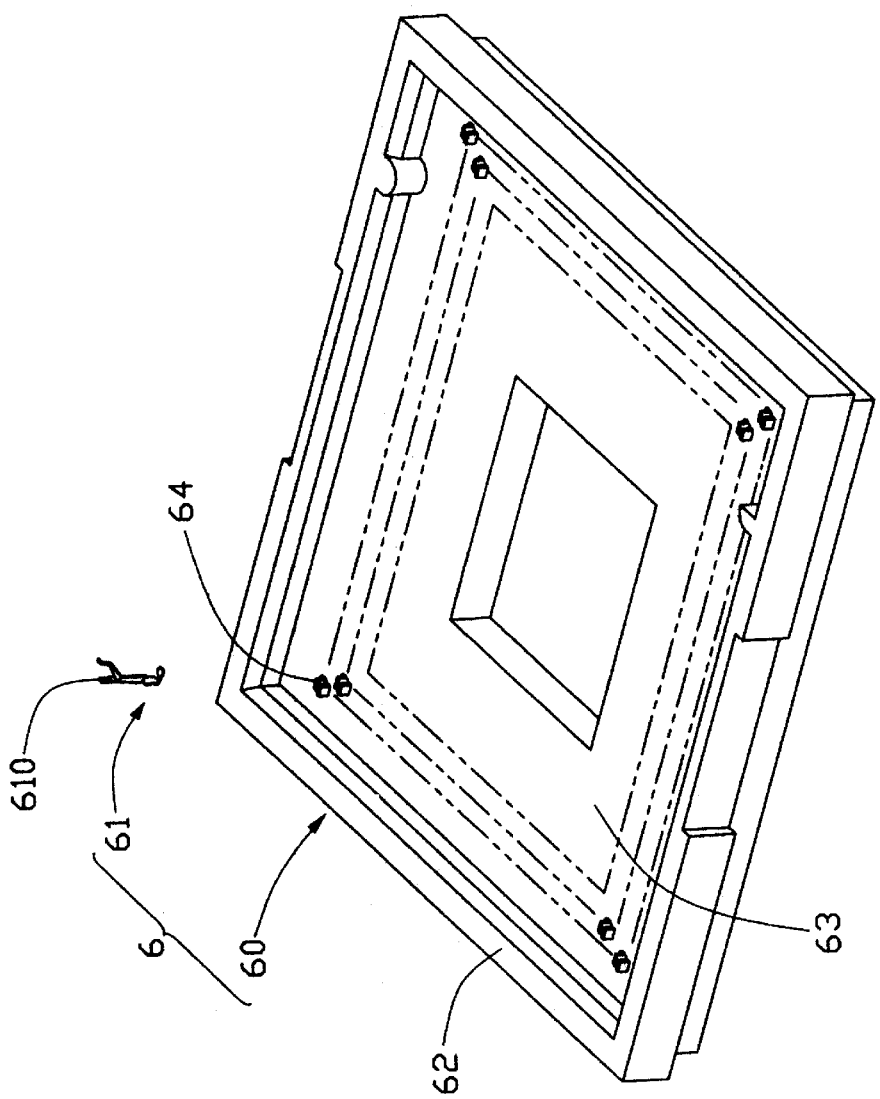
FIG. 4 is a simplified, exploded isometric view of a conventional LAG electrical connector.
Figure 5:
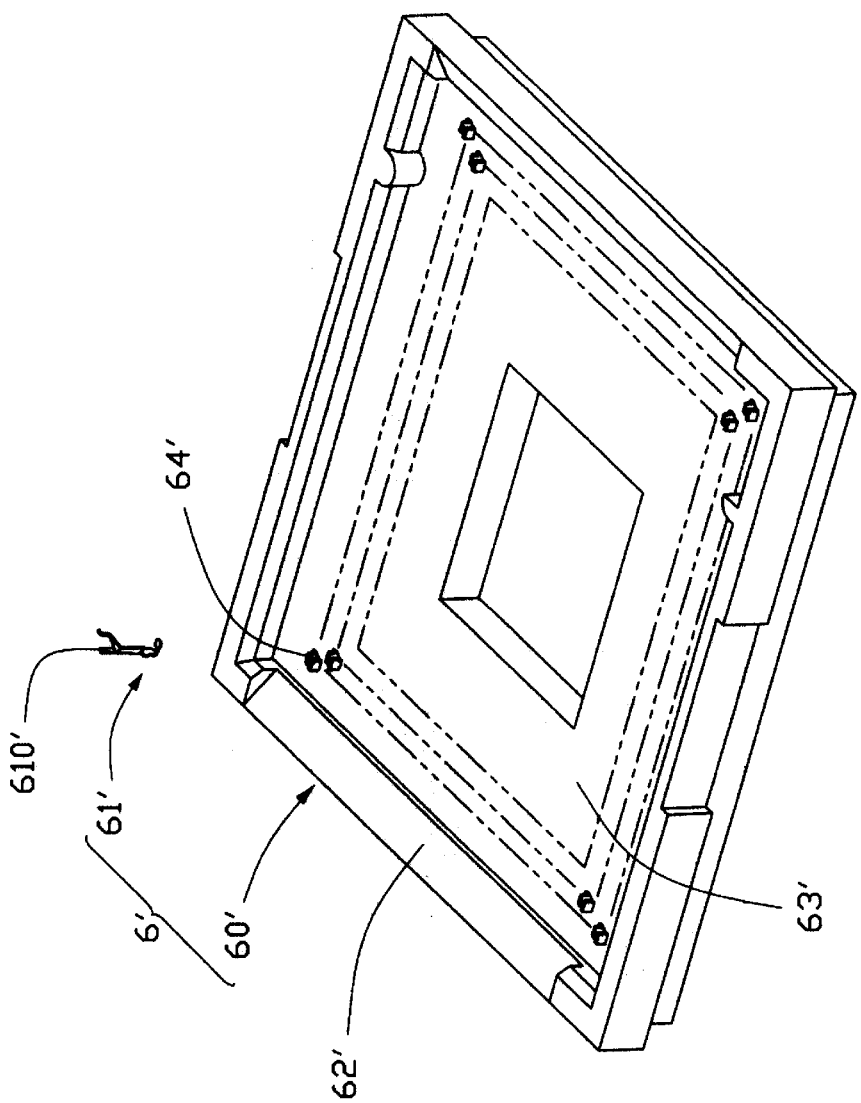
FIG. 5 is a simplified, exploded isometric view of another conventional LAG electrical connector.

Referring to FIG. 3, a plurality of complementary blocks 12 is provided for fittingly engaging in the recesses 1021 of the first sidewalls 102 respectively. In the preferred embodiment of the present invention, a configuration and size of each block 12 is similar to a configuration and size of each projection 1020. When each block 12 is engaged in its corresponding recess 1021, a flat face of the block 12 is coplanar with the first surfaces 1022 of the adjacent projections 1020 of the first sidewalls 102. Thus the first sidewalls 102 in cooperation with the blocks 12 provide more contact surface area for enhanced retention of the LAG chip there between.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector assembly, comprising:

a plurality of carrier strips each comprising a row of conductive terminals, and each further comprising a row of connecting sections respectively connecting the terminals with a main body of the carrier strip;

an electrical connector comprising an insulative housing defining a plurality of passageways for receiving corresponding terminal therein, the housing comprising a plurality of sidewalls, at least one of the sidewalls defining a plurality of recesses and thereby forming a plurality of projections;

wherein the connecting sections of at least one of the carrier strips can be received in corresponding recess for facilitating installation of the terminals of the at least one carrier strip in corresponding passageways of the housing;

wherein each of the projections comprises an inmost first surface for abutting an electronic package, a top second surface, and a chamfered surface between the first surface and the second surface;

wherein the connector assembly further comprising a plurality of blocks for fittingly engaging in the recesses of the at least one sidewalls respectively after the main body of the carrier strip being removed;

wherein a configuration of each of the blocks is similar to a configuration of each of the projections.

2. The electrical connector assembly as claimed in claim 1, wherein an inner portion of each of the recesses is disposed lower than an outer portion thereof.

3. The electrical connector assembly as claimed in claim 1, wherein a side elevation cross-section of each of the projections is trapezium-shaped.

* * * * *